(12) United States Patent
Takeuchi (10) Patent No.: US 10,249,225 B2
(45) Date of Patent: Apr. 2, 2019

(54) OVERCURRENT DETECTION CIRCUIT

(71) Applicant: Rohm Co., Ltd., Kyoto (JP)

(72) Inventor: Hiroki Takeuchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/479,780

(22) Filed: Apr. 5, 2017

(65) Prior Publication Data

US 2017/0294154 A1    Oct. 12, 2017

(30) Foreign Application Priority Data

Apr. 6, 2016  (JP) ................................. 2016-076436

(51) Int. Cl.
| | |
|---|---|
| *G09G 3/00* | (2006.01) |
| *G01R 19/165* | (2006.01) |
| *G09G 3/36* | (2006.01) |
| *H03K 19/0175* | (2006.01) |
| *H03K 17/082* | (2006.01) |

(52) U.S. Cl.
CPC ....... *G09G 3/006* (2013.01); *G01R 19/16533* (2013.01); *G09G 3/36* (2013.01); *G09G 3/3677* (2013.01); *H03K 17/0822* (2013.01); *H03K 19/017509* (2013.01); *G09G 2310/0289* (2013.01); *G09G 2310/08* (2013.01); *G09G 2330/04* (2013.01); *G09G 2330/12* (2013.01)

(58) Field of Classification Search
CPC ........ G09G 3/006; G09G 3/36; G09G 3/3677; G09G 2330/04; G09G 2310/08; G09G 2310/0289; G09G 2330/12; H03K 17/0822; H03K 19/017509; G01R 19/16533

See application file for complete search history.

(56) References Cited

U.S. PATENT DOCUMENTS

| | | | | |
|---|---|---|---|---|
| 5,481,178 | A * | 1/1996 | Wilcox ................. | H02M 3/156 323/224 |
| 7,880,455 | B2 * | 2/2011 | Wu ........................ | H02M 1/32 323/284 |
| 7,884,583 | B2 * | 2/2011 | Lenz ...................... | H02M 1/38 323/222 |
| 7,932,703 | B2 * | 4/2011 | Brohlin ................. | H02M 3/158 323/222 |
| 7,965,070 | B2 * | 6/2011 | Nakahashi ............ | H02M 3/156 323/282 |

(Continued)

FOREIGN PATENT DOCUMENTS

JP          11-168829          6/1999

*Primary Examiner* — Jose R Soto Lopez
(74) *Attorney, Agent, or Firm* — Fish & Richardson P.C.

(57) ABSTRACT

An overcurrent detection circuit, which detects overcurrent of a load driving device arranged to drive a capacitance load by switching a voltage applied to the capacitance load between high level and low level, includes a clock signal generation unit arranged to generate a clock signal, a comparing unit arranged to compare a physical quantity corresponding to current supplied from the load driving device to the capacitance load with a predetermined value, and a determination unit arranged to determine whether or not the load driving device is in an overcurrent state based on the clock signal and a result of the comparison by the comparing unit, during a period in which the load driving device applies a high level voltage to the capacitance load.

34 Claims, 9 Drawing Sheets

(56) References Cited

U.S. PATENT DOCUMENTS

| | | | | |
|---|---|---|---|---|
| 8,441,239 B2* | 5/2013 | Miyamae | H02M 3/156 | 323/271 |
| 9,048,734 B2* | 6/2015 | Qin | H02M 1/32 | |
| 2007/0046275 A1* | 3/2007 | Shirai | H02M 3/1588 | 323/284 |
| 2008/0049465 A1* | 2/2008 | Parto | H02M 1/36 | 363/49 |
| 2008/0067989 A1* | 3/2008 | Kasai | H02M 3/1588 | 323/271 |
| 2008/0197821 A1* | 8/2008 | Hasegawa | H02M 1/36 | 323/238 |
| 2008/0203926 A1* | 8/2008 | Ikegami | G09G 3/296 | 315/127 |
| 2009/0108908 A1* | 4/2009 | Yamadaya | H02M 1/08 | 327/390 |
| 2010/0001704 A1* | 1/2010 | Williams | H02M 3/157 | 323/283 |
| 2010/0019749 A1* | 1/2010 | Katsuya | H02M 1/15 | 323/282 |
| 2010/0079127 A1* | 4/2010 | Grant | H02M 3/156 | 323/285 |
| 2010/0085675 A1* | 4/2010 | Oki | H02M 1/08 | 361/101 |
| 2010/0231187 A1* | 9/2010 | Wicht | H02M 3/156 | 323/282 |
| 2011/0018516 A1* | 1/2011 | Notman | H02M 3/1588 | 323/284 |
| 2011/0043176 A1* | 2/2011 | Sohma | H02M 3/1588 | 323/282 |
| 2011/0080205 A1* | 4/2011 | Lee | H03K 17/0822 | 327/390 |
| 2011/0127975 A1* | 6/2011 | Hosokawa | H02M 3/1588 | 323/271 |
| 2011/0133711 A1* | 6/2011 | Murakami | H03K 17/0822 | 323/282 |
| 2012/0049829 A1* | 3/2012 | Murakami | H02M 1/32 | 323/288 |
| 2013/0308061 A1* | 11/2013 | Murakami | H02M 3/1582 | 348/730 |
| 2014/0043875 A1* | 2/2014 | Hsing | G05F 1/56 | 363/77 |
| 2014/0077790 A1* | 3/2014 | Sohma | H02M 3/1588 | 323/313 |
| 2015/0229212 A1* | 8/2015 | Shiwaya | H02M 3/158 | 323/282 |
| 2015/0364913 A1* | 12/2015 | Minoya | H02H 9/025 | 361/93.9 |
| 2016/0191000 A1* | 6/2016 | Takahama | G01R 19/16509 | 330/298 |
| 2016/0221332 A1* | 8/2016 | Sano | B41J 2/04541 | |
| 2017/0264184 A1* | 9/2017 | Tezuka | H03K 17/687 | |

* cited by examiner

OVERCURRENT DETECTION CIRCUIT

CROSS-REFERENCE TO RELATED APPLICATIONS

This nonprovisional application claims priority under 35 U.S.C. § 119(a) on Patent Application No. 2016-076436 filed in Japan on Apr. 6, 2016, the entire contents of which are hereby incorporated by reference.

BACKGROUND OF THE INVENTION

Field of the Invention

The present invention relates to an overcurrent detection circuit.

Description of Related Art

In a liquid crystal display panel of a type in which pixel circuits and a gate driver are directly mounted on a glass substrate, thin-film transistors are used for operating the gate driver, and hence it is necessary to supply a high voltage to the gate driver. Therefore, a level shifter that performs signal level conversion (amplification of voltage amplitude) is disposed at a front stage of the gate driver.

The level shifter disposed at the front stage of the gate driver drives the liquid crystal pixel that is a capacitance load. For this reason, charging current flows from the level shifter to the capacitance load when output voltage of the level shifter is switched from low level to high level, and discharge current flows from the capacitance load to the level shifter when the output voltage of the level shifter is switched from high level to low level.

Therefore, in order to detect overcurrent of the capacitance load driving level shifter, it is necessary to discriminate between charge/discharge current of the capacitance load and overcurrent due to occurrence of abnormality in the capacitance load. A general overcurrent detection circuit that detects overcurrent of the capacitance load driving level shifter performs the above-mentioned discrimination using an RC filter.

Figure 7:
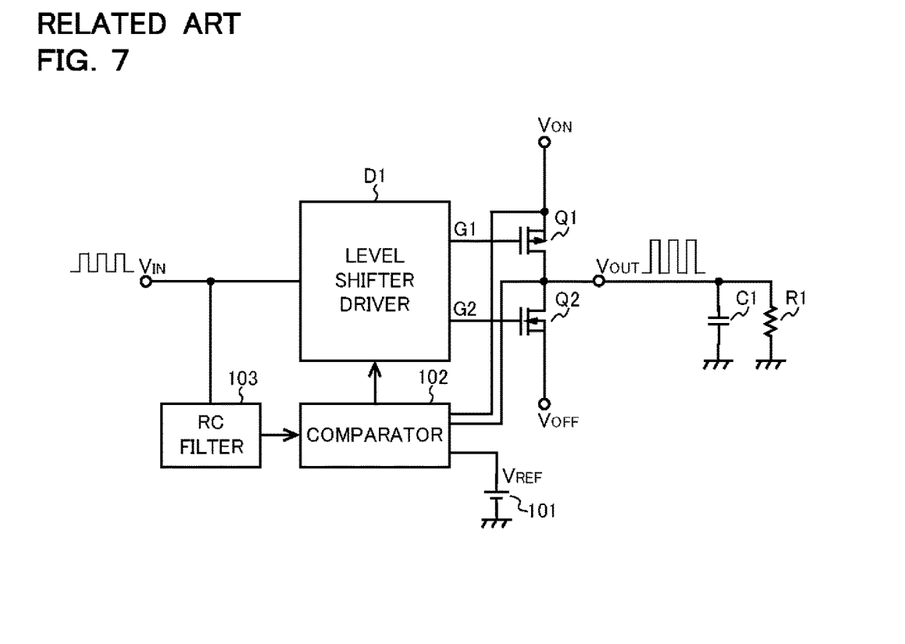
FIG. 7 is a diagram illustrating a structure of a level shifter and a general overcurrent detection circuit.

FIG. 7 is a diagram illustrating a structure of a capacitance load driving level shifter and a general overcurrent detection circuit that detects overcurrent thereof.

The capacitance load driving level shifter is constituted of a level shifter driver D1, a P-channel MOS transistor Q1, and an N-channel MOS transistor Q2. The level shifter driver D1 receives an input voltage $V_{IN}$ that is a pulse signal, generates a first gate signal G1 having an inverted logic value of the input voltage $V_{IN}$ and a second gate signal G2, supplies the first gate signal G1 to the MOS transistor Q1, and supplies the second gate signal G2 to the MOS transistor Q2. Thus, the MOS transistor Q1 and the MOS transistor Q2 are repeatedly turned on an off in a complementary manner.

An on-voltage $V_{ON}$ is applied to the source of the MOS transistor Q1, and an off-voltage $V_{OFF}$ that is lower than the on-voltage $V_{ON}$ is applied to the source of the MOS transistor Q2. Therefore, an output voltage $V_{OUT}$ generated at a connection node between the drain of the MOS transistor Q1 and the drain of the MOS transistor Q2 is a signal having the same logic value as the input voltage $V_{IN}$ and a voltage amplitude equal to a difference between the on-voltage $V_{ON}$ and the off-voltage $V_{OFF}$. The output voltage $V_{OUT}$ is supplied to the capacitance load constituted of a capacitor C1 and a resistor R1.

The general overcurrent detection circuit is constituted of a reference voltage source 101, a comparator 102, and an RC filter 103. The reference voltage source 101 generates a reference voltage $V_{REF}$ corresponding to an overcurrent detection level $LV_{OCP}$ and outputs it to the comparator 102. The comparator 102 compares a drain-source voltage $V_{DS}$ of the MOS transistor Q1 with the reference voltage $V_{REF}$. However, the comparator 102 does not perform the above-mentioned comparing operation during a period in which the input voltage $V_{IN}$ is low level and the period after the input voltage $V_{IN}$ is switched from low level to high level until a mask period elapses. The length of the mask period is determined by the time constant of the RC filter 103. Note that when the MOS transistor Q1 is on state, the drain-source voltage $V_{DS}$ of the MOS transistor Q1 is proportional to current $I_{DS}$ that flows in the MOS transistor Q1.

When it is detected that the drain-source voltage $V_{DS}$ of the MOS transistor Q1 is higher than the reference voltage $V_{REF}$ by the comparing operation of the comparator 102, operation of the level shifter driver D1 is stopped in accordance with a comparison result signal output from the comparator 102. Thus, overcurrent protection is achieved.

Figure 8:
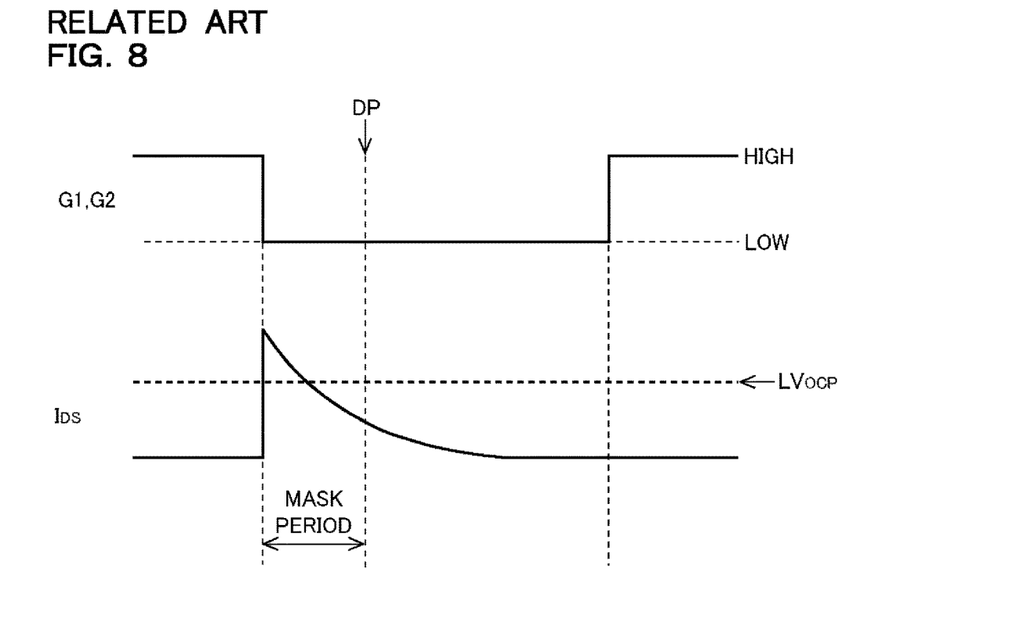
FIG. 8 is a diagram illustrating a current waveform in a case where abnormality has not occurred in the capacitance load.
Figure 9:
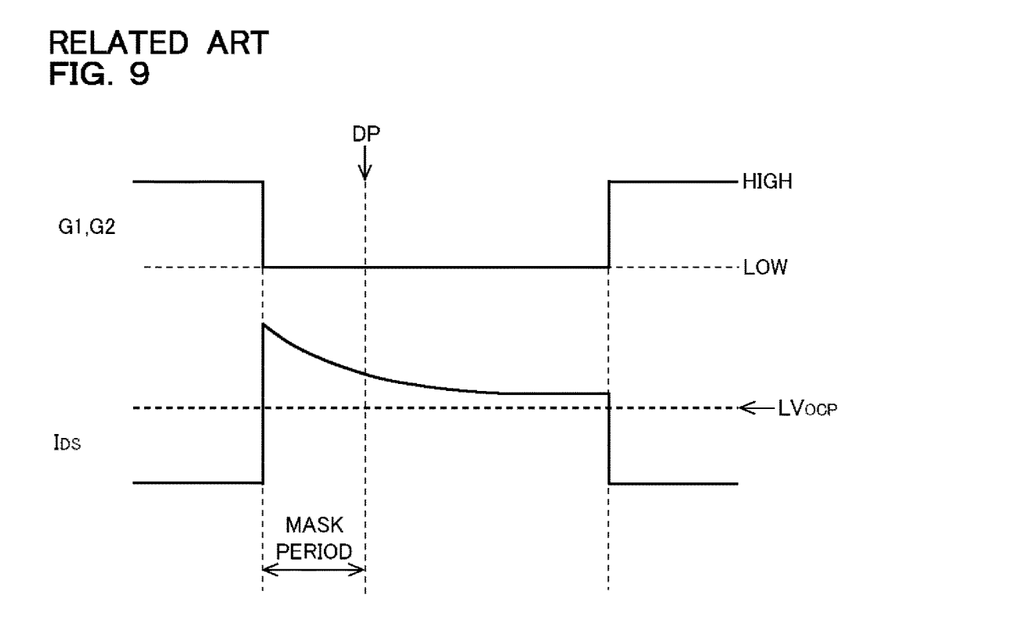
FIG. 9 is a diagram illustrating a current waveform in a case where abnormality has occurred in the capacitance load.

As illustrated in FIGS. 8 and 9, the current $I_{DS}$ that flows in the MOS transistor Q1 becomes largest due to the charging current of the capacitance load at a time point when the input voltage $V_{IN}$ is switched from low level to high level, i.e., at a start time point of the mask period, and then is gradually decreased along with a decrease in the charging current of the capacitance load.

Therefore, an end time point of the mask period becomes a detection point DP of overcurrent. As illustrated in FIG. 8, if the current $I_{DS}$ flowing in the MOS transistor Q1 is the overcurrent detection level $LV_{OCP}$ or less at the overcurrent detection point DP, overcurrent is not detected. As illustrated in FIG. 9, if the current $I_{DS}$ flowing in the MOS transistor Q1 is larger than the overcurrent detection level $LV_{OCP}$ at the overcurrent detection point DP, the overcurrent is detected.

However, the time constant of the RC filter 103 has a large variation, and hence the overcurrent detection point DP varies due to the variation of the time constant of the RC filter 103. For this reason, the general overcurrent detection circuit cannot accurately detect the overcurrent due to occurrence of abnormality in the capacitance load.

Note that an overcurrent control unit disclosed in JP-A-11-168829 uses a time constant circuit constituted of a resistor and a capacitor so as not to perform the overcurrent detection until a predetermined time elapses after power is turned on. For this reason, the overcurrent control unit disclosed in JP-A-11-168829 also cannot accurately detect the overcurrent due to the occurrence of abnormality in the capacitance load similarly to the general overcurrent detection circuit described above.

SUMMARY OF THE INVENTION

It is an object of the present invention to provide an overcurrent detection circuit that can accurately detect overcurrent due to occurrence of abnormality in a capacitance load.

An example of the overcurrent detection circuit disclosed in this specification is an overcurrent detection circuit that detects overcurrent of a load driving device arranged to drive a capacitance load by switching a voltage applied to the capacitance load between high level and low level. The overcurrent detection circuit includes a clock signal generation unit arranged to generate a clock signal, a comparing unit arranged to compare a physical quantity corresponding to current supplied from the load driving device to the capacitance load with a predetermined value, and a determination unit arranged to determine whether or not the load driving device is in an overcurrent state on the basis of the clock signal and a result of the comparison by the comparing unit, during a period in which the load driving device applies a high level voltage to the capacitance load.

Another example of the overcurrent detection circuit disclosed in this specification is an overcurrent detection circuit that detects overcurrent of a load driving device that drives a capacitance load by switching a voltage applied to the capacitance load between high level and low level. The overcurrent detection circuit includes a clock signal generation unit arranged to generate a clock signal, a comparing unit arranged to compare a physical quantity corresponding to current supplied from the capacitance load to the load driving device with a predetermined value, and a determination unit arranged to determine whether or not the load driving device is in an overcurrent state based on the clock signal and a result of the comparison by the comparing unit, during a period in which the load driving device applies a low level voltage to the capacitance load.

The load driving device having an overcurrent detection function disclosed in this specification includes a load driving device arranged to drive a capacitance load, and the overcurrent detection circuit arranged to detect overcurrent of the load driving device, which has one of the structures described above.

A liquid crystal display device disclosed in this specification includes a liquid crystal display panel including a gate driver, and the load driving device having an overcurrent detection function, which includes a level shifter arranged to supply an output signal to the gate driver and has the structure described above.

The meanings and effects of the present invention will become more apparent from the description of an embodiment given below. However, the embodiment described below is merely an embodiment of the present invention, and meanings of the present invention and terms of structural components are not limited to those described in the following embodiment.

DETAILED DESCRIPTION OF THE PREFERRED EMBODIMENTS

<Level Shifter Having Overcurrent Detection Function>

Figure 1A:
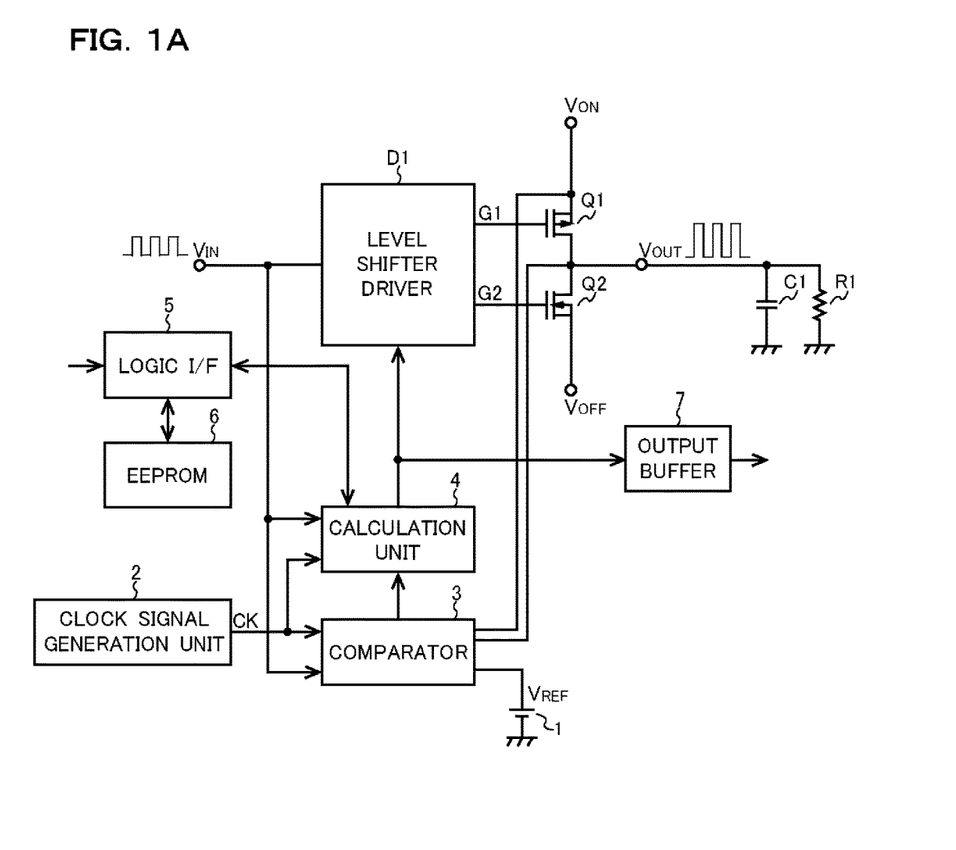
FIG. 1A is a diagram illustrating one structural example of a level shifter having an overcurrent detection function.

FIG. 1A is a diagram illustrating one structural example of a level shifter having the overcurrent detection function. The level shifter having the overcurrent detection function illustrated in FIG. 1A is constituted of a capacitance load driving level shifter and an overcurrent detection circuit.

The capacitance load driving level shifter is constituted of a level shifter driver D1, a P-channel MOS transistor Q1, and an N-channel MOS transistor Q2, which are the same structure as the capacitance load driving level shifter illustrated in FIG. 7, and hence detailed description thereof is omitted. Note that FIG. 1A illustrates waveforms of an input voltage $V_{IN}$ and an output voltage $V_{OUT}$ in a case where the voltage amplitude of the output voltage $V_{OUT}$ is set larger than the voltage amplitude of the input voltage $V_{IN}$, but it is possible to adjust set values of an on-voltage $V_{ON}$ and an off-voltage $V_{OFF}$ so that the voltage amplitude of the output voltage $V_{OUT}$ is smaller than the voltage amplitude of the input voltage $V_{IN}$. In addition, it is also possible to adjust set values of the on-voltage $V_{ON}$ and the off-voltage $V_{OFF}$ so that the output voltage $V_{OUT}$ and the input voltage $V_{IN}$ have the same voltage amplitude while the output voltage $V_{OUT}$ and the input voltage $V_{IN}$ have different high level values and different low level values.

The overcurrent detection circuit includes a reference voltage source 1, a clock signal generation unit 2, a comparator 3, a calculation unit 4, a logic interface unit 5, an electrically erasable programmable read-only memory (EEPROM) 6, and an output buffer 7.

The reference voltage source 1 generates a reference voltage $V_{REF}$ corresponding to an overcurrent detection level $LV_{OCP}$ and outputs it to the comparator 3. The clock signal generation unit 2 generates a clock signal CK having a higher frequency than the input voltage $V_{IN}$ and outputs the clock signal CK to the comparator 3 and the calculation unit 4.

The comparator 3 compares a drain-source voltage $V_{DS}$ of the MOS transistor Q1 with the reference voltage $V_{REF}$ at a rising timing of the clock signal CK, during a period in which the input voltage $V_{IN}$ is high level (period in which the P-channel MOS transistor Q1 is on state), on the basis of the input voltage $V_{IN}$ and the clock signal CK, and outputs a result of the comparison to the calculation unit 4. Note that, when the MOS transistor Q1 is on state, the drain-source voltage $V_{DS}$ of the MOS transistor Q1 is proportional to current $I_{DS}$ that flows in the MOS transistor Q1.

The calculation unit 4 receives a result of the comparison by the comparator 3 at a rising timing of the clock signal CK, during a period in which the input voltage $V_{IN}$ is high level (period in which the P-channel MOS transistor Q1 is on state), on the basis of the input voltage $V_{IN}$ and the clock signal CK.

The calculation unit 4 counts the number of clocks in the clock signal CK during a failure period in one continuous period of high level of the input voltage $V_{IN}$ (one continuous period of on state of the P-channel MOS transistor Q1). The failure period is a period in which the comparison result shows that the drain-source voltage $V_{DS}$ of the MOS transistor Q1 is the reference voltage $V_{REF}$ or higher.

The calculation unit 4 also counts the number of clocks in the clock signal CK during a pass period in one continuous period of high level of the input voltage $V_{IN}$ (one continuous period of on state of the P-channel MOS transistor Q1). The pass period is a period in which the comparison result shows that the drain-source voltage $V_{DS}$ of the MOS transistor Q1 is lower than the reference voltage $V_{REF}$.

Figure 2:
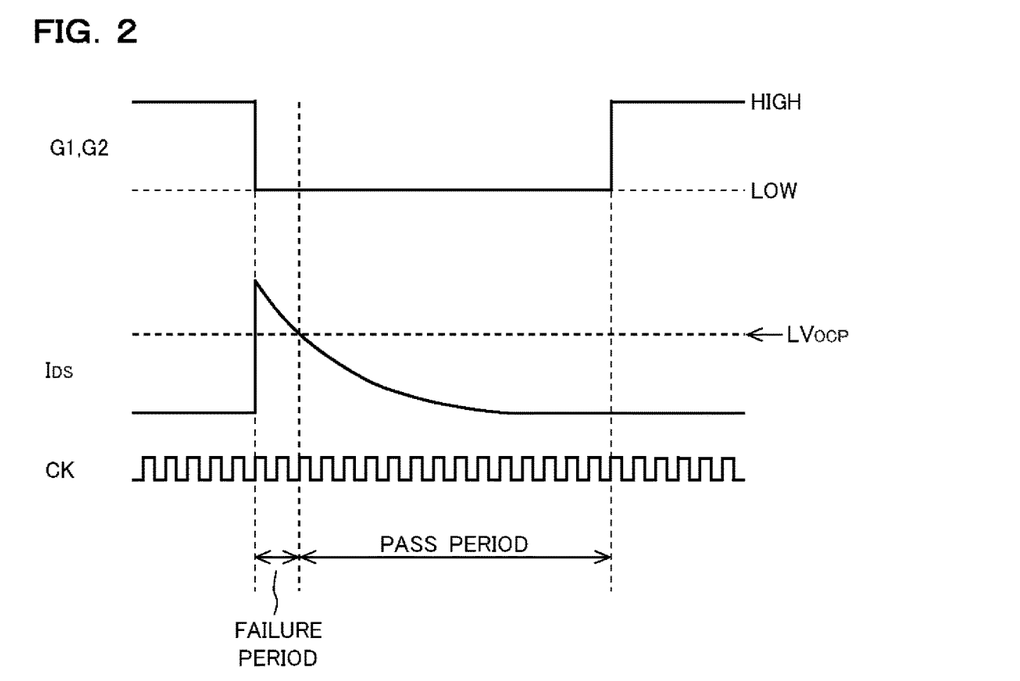
FIG. 2 is a diagram illustrating a current waveform in a case where abnormality has not occurred in a capacitance load.
Figure 3:
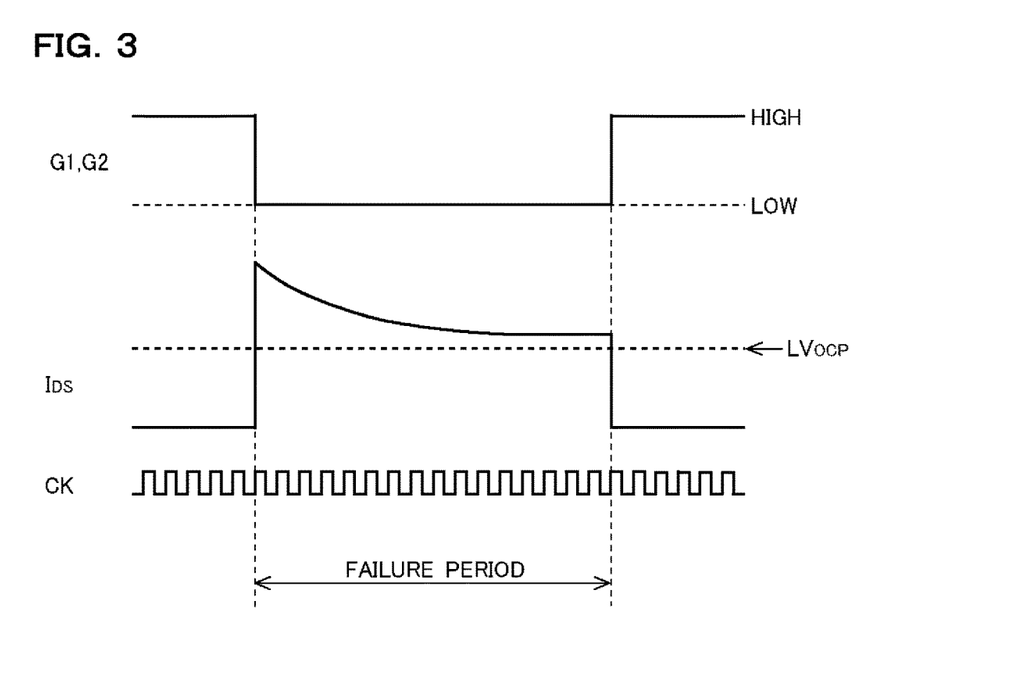
FIG. 3 is a diagram illustrating a current waveform in a case where abnormality has occurred in the capacitance load.

As illustrated in FIGS. 2 and 3, the current $I_{DS}$ that flows in the MOS transistor Q1 becomes largest due to the charging current of the capacitance load at a time point when the input voltage $V_{IN}$ is switched from low level to high level, i.e., at a start time point of the one continuous period of on state of the P-channel MOS transistor Q1, and then is gradually decreased along with a decrease in the charging current of the capacitance load.

For this reason, if an overcurrent due to occurrence of abnormality in the capacitance load is not flowing, as illustrated in FIG. 2, the number of clocks in the clock signal CK during the failure period becomes small (two in the example illustrated in FIG. 2), and the number of clocks in the clock signal CK during the pass period becomes large (fourteen in the example illustrated in FIG. 2). In contrast, if the overcurrent due to occurrence of abnormality in the capacitance load is flowing, as illustrated in FIG. 3, the number of clocks in the clock signal CK during the failure period becomes large (sixteen in the example illustrated in FIG. 3), and the number of clocks in the clock signal CK during the pass period becomes small (zero in the example illustrated in FIG. 3). In addition, the pass period appears only after the failure period.

Therefore, the calculation unit 4 should determine whether or not the overcurrent due to occurrence of abnormality in the capacitance load is flowing on the basis of one of the following determination criteria (1) to (4).
(1) If the number of clocks in the clock signal CK during the failure period is a first threshold value or more, it is determined that the overcurrent is flowing.
(2) If the number of clocks in the clock signal CK during the pass period is a second threshold value or less, it is determined that the overcurrent is flowing.
(3) If the ratio of the number of clocks in the clock signal CK during the pass period to the number of clocks in the clock signal CK during the failure period is a third threshold value or less, it is determined that the overcurrent is flowing.
(4) If the drain-source voltage $V_{DS}$ of the MOS transistor Q1 is the reference voltage $V_{REF}$ or higher at a rising time point of a predetermined order of clock in the clock signal CK during one continuous period of on state of the P-channel MOS transistor Q1, it is determined that the overcurrent is flowing.

When the level shifter having the overcurrent detection function of this structural example uses one of the determination criteria (1) to (3) described above, because the comparison results at a plurality of points are used for determination, overcurrent detection accuracy is higher than that in the overcurrent detection circuit illustrated in FIG. 7, in which only the comparison result at an overcurrent detection point DP is used for determination.

When the level shifter having the overcurrent detection function of this structural example uses the determination criterion (4), only the comparison result at one point is used for determination. However, because the one point is determined by the clock signal, point position variation becomes smaller than that at the overcurrent detection point DP that is determined by the time constant of the RC filter, and hence the overcurrent detection accuracy becomes higher than that of the overcurrent detection circuit illustrated in FIG. 7.

For example, when the level shifter having the overcurrent detection function of this structural example is mounted to a liquid crystal television set, a capacitance value of the capacitance load may change depending on a model of the liquid crystal television set. However, the level shifter having the overcurrent detection function of this structural example can easily support a change in the capacitance value of the capacitance load, by changing set values of parameters (such as the first threshold value) used in the determination criteria (1) to (4) described above. In other words, the level shifter having the overcurrent detection function of this structural example has high redundancy in determination whether or not the overcurrent due to occurrence of abnormality in the capacitance load is flowing. For example, set values of the parameters (such as the first threshold value) used in the determination criteria (1) to (4) may be stored in the EEPROM 6, and the set values of the parameters (such as the first threshold value) used in the determination criteria (1) to (4) may be rewritten externally via the logic interface unit using a bus such as I2C.

It is preferred that the calculation unit 4 should store a result of the decision made according to one of the determination criteria (1) to (4) described above, in a register of the calculation unit 4, and should detect the overcurrent when the number of decision results indicating that the overcurrent is flowing reaches a predetermined number equal to or more than two. It may be possible to detect the overcurrent when one decision result indicating that the overcurrent is flowing is obtained, but in this case, misdetection due to noise or the like may occur. Note that the above-mentioned condition that the number of decision results indicating that the overcurrent is flowing reaches a predetermined number equal to or more than two may be, for example, a condition that the number of decision results indicating that the overcurrent is flowing reaches a predetermined number continuously without inserting a decision result that the overcurrent is not flowing, or a condition that a predetermined number (e.g. three) of decision results indicating that the overcurrent is flowing are obtained among a set of continuous decision results of a number (e.g. five) larger than the predetermined number.

When detecting the overcurrent, the calculation unit 4 should perform at least one of the following processes (i) to (iii).
(i) Stop operation of the level shifter driver D1. Thus, overcurrent protection is achieved.
(ii) Output externally a signal informing that the overcurrent is detected, via the output buffer 7.
(iii) Store information that the overcurrent is detected, in the EEPROM 6 via the logic interface unit 5.

In addition, for example, it is possible to store the number of clocks in the clock signal CK during the failure period used in one of the determination criteria (1) to (4) described above, as log data in the EEPROM 6. By analyzing this log data, it is possible to detect that there is a tendency to gradually approach overcurrent even if the overcurrent is not yet detected.

Application to Liquid Crystal Television Set

Figure 4:
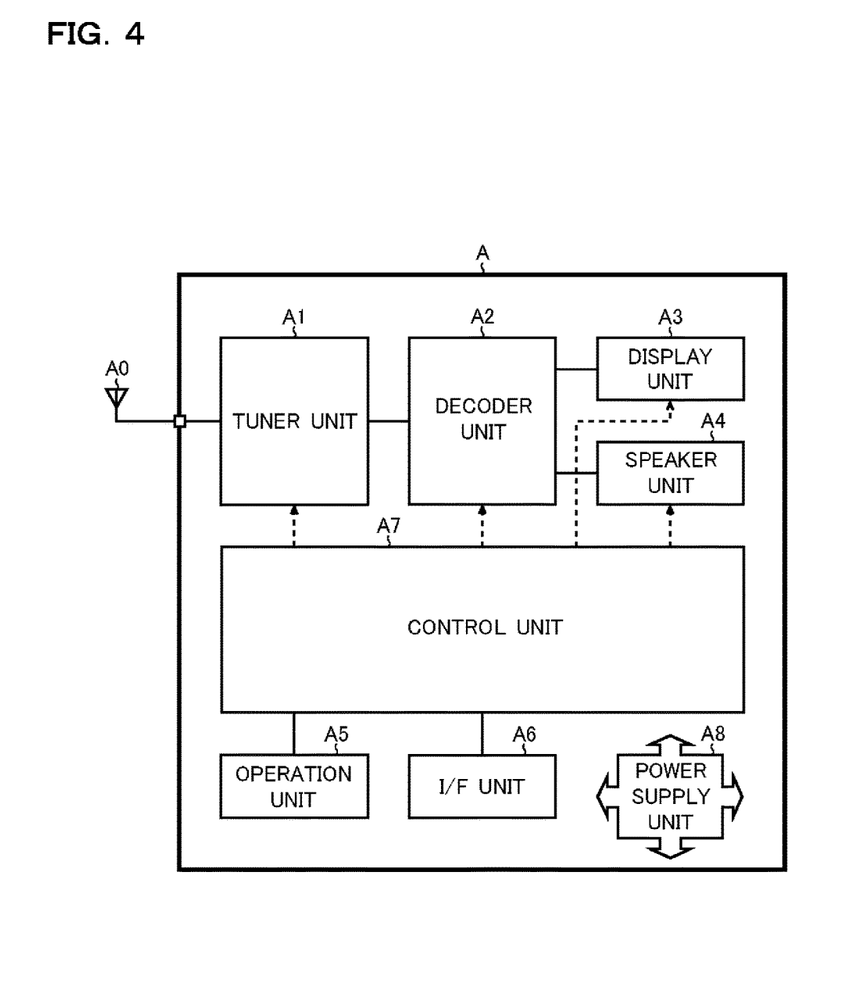
FIG. 4 is a block diagram illustrating one structural example of a liquid crystal television set.
Figure 5:
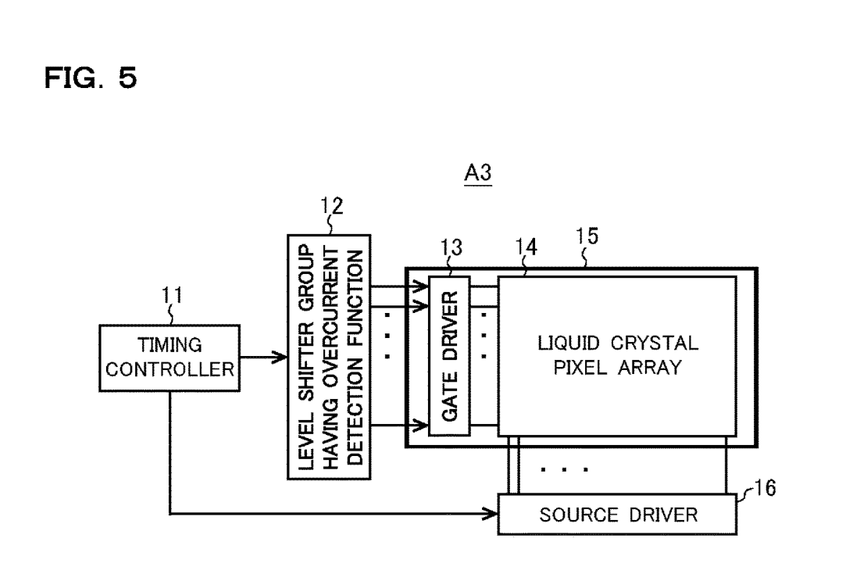
FIG. 5 is a block diagram illustrating one structural example of a display unit.

FIG. 4 is a block diagram illustrating one structural example of a liquid crystal television set equipped with the level shifter having the overcurrent detection function described above. In addition, FIG. 5 is a diagram illustrating a schematic structural example of a display unit mounted to the liquid crystal television set.

A liquid crystal television set A of this structural example includes a tuner unit A1, a decoder unit A2, a display unit A3, a speaker unit A4, an operation unit A5, an interface unit A6, a control unit A7, and a power supply unit A8.

The display unit A3 includes a timing controller 11, a level shifter group having the overcurrent detection function 12, a liquid crystal display panel 15 including a gate driver 13 and a liquid crystal pixel array 14, and a source driver 16. The gate driver 13 and the liquid crystal pixel array 14 are directly mounted on the glass substrate of the liquid crystal display panel 15.

The liquid crystal pixel array 14 includes a plurality of data lines, a plurality of scan lines disposed to be perpendicular to the plurality of data lines, and a plurality of pixel circuits arranged in a matrix at intersections of the data lines and the scan lines. The gate driver 13 sequentially selects one of the plurality of scan lines of the liquid crystal pixel array 14. The source driver 16 applies gradation voltages (analog voltages corresponding to light emission gradation) to the data lines of the liquid crystal pixel array 14 so as to drive the data lines of the liquid crystal pixel array 14.

The timing controller 11 controls timings of operations of the gate driver 13 and the source driver 16. The pixel circuits of the liquid crystal pixel array 14 have a liquid crystal layer so as to change the transmittance of the liquid crystal layer in accordance with the gradation voltage applied to the corresponding data line when being selected by the corresponding scan line.

The level shifter group having the overcurrent detection function 12 is disposed between the timing controller 11 and the gate driver 13. The level shifter group having the overcurrent detection function 12 includes the level shifters having the overcurrent detection function of the same number as the scan lines of the liquid crystal pixel array 14. The timing controller 11 sequentially supplies pulse signals to the level shifters in the level shifter group having the overcurrent detection function 12. The pulse signal output from the timing controller 11 to the level shifter group having the overcurrent detection function 12 is, for example, a signal that is pulse-driven between 0 V and 3.3 V. On the other hand, the pulse signal output from the level shifter group having the overcurrent detection function 12 to the gate driver 13 is, for example, a signal that is pulse-driven between −12 V and 30 V. In other words, each level shifter in the level shifter group having the overcurrent detection function 12 outputs a pulse signal (corresponding to the output voltage $V_{OUT}$) having a larger voltage amplitude than the input pulse signal (corresponding to the input voltage $V_{IN}$).

Figure 6A:
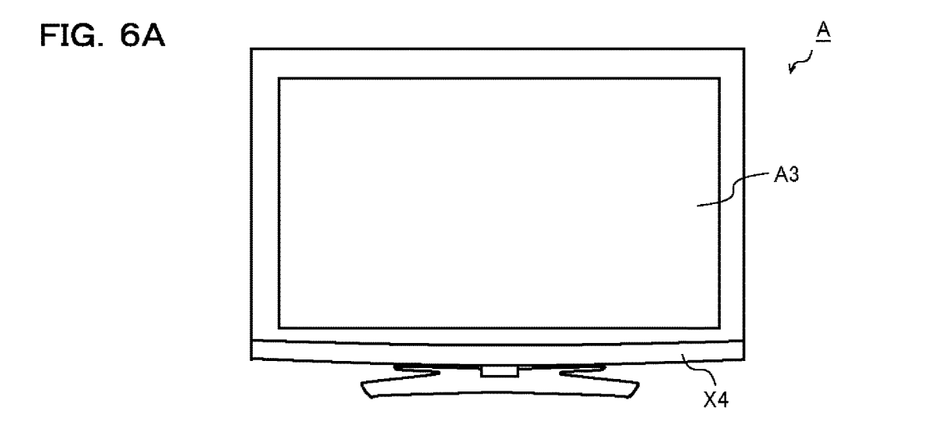
FIG. 6A is a front view of the liquid crystal television set.
Figure 6B:
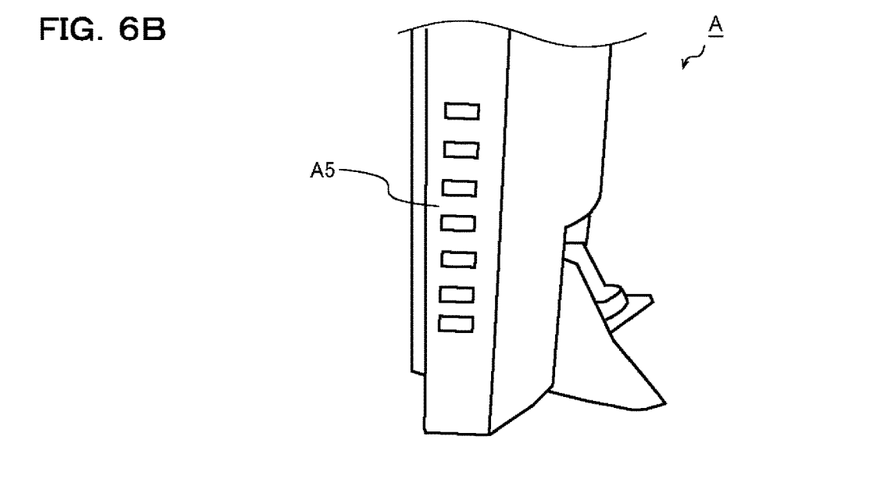
FIG. 6B is a side view of the liquid crystal television set.
Figure 6C:
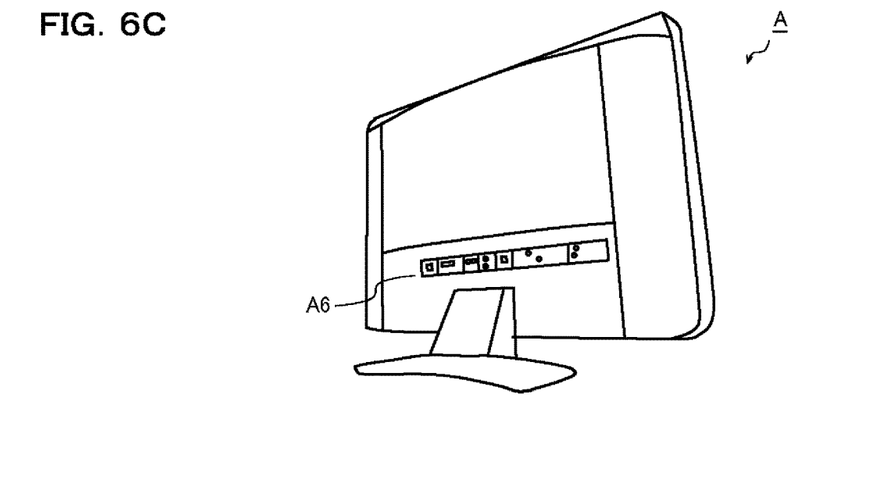
FIG. 6C is a rear view of the liquid crystal television set.

In addition, FIGS. 6A to 6C respectively illustrate a front view, a side view, and a rear view of a liquid crystal television set equipped with the level shifter having the overcurrent detection function.

The tuner unit A1 selects a broadcasting signal of a desired channel from a reception signal received by an antenna A0 connected externally to the liquid crystal television set A.

The decoder unit A2 generates a video signal and a sound signal from the broadcasting signal selected by the tuner A1. In addition, the decoder unit A2 also has a function of generating a video signal and a sound signal on the basis of an external input signal from the interface unit A6.

The display unit A3 outputs an image of the video signal generated by the decoder unit A2.

The speaker unit A4 outputs sound of the sound signal generated by the decoder unit A2.

The operation unit A5 is one of human interfaces that receive user's operation. As the operation unit A5, buttons, switches, a remote controller, or the like can be used.

The interface unit A6 is a front end that receives an external input signal from an external device (such as an optical disc player or a hard disk drive).

The control unit A7 controls operations of the individual units A1 to A6 described above in an integrated manner. As the control unit A7, a central processing unit (CPU) or the like can be used.

The power supply unit A8 supplies electric power to the individual units A1 to A7 described above.

Other Variations

Note that, other than the embodiment described above, the structure of the present invention can be variously modified within the scope of the present invention without deviating the spirit thereof.

In the embodiment described above, the overcurrent detection is performed on the basis of a result of the comparison by the comparator 3 at a rising timing of the clock signal CK, but the overcurrent detection may be performed on the basis of a result of the comparison by the comparator 3 at a falling timing of the clock signal CK.

In the embodiment described above, the level shifter having the overcurrent detection function is applied to the liquid crystal television set, but it may be applied to other liquid crystal display devices such as a liquid crystal monitor of a personal computer.

In addition, in the embodiment described above, the overcurrent detection circuit is applied to the level shifter, but it may be applied to other load driving devices that drive capacitance loads.

Figure 1B:
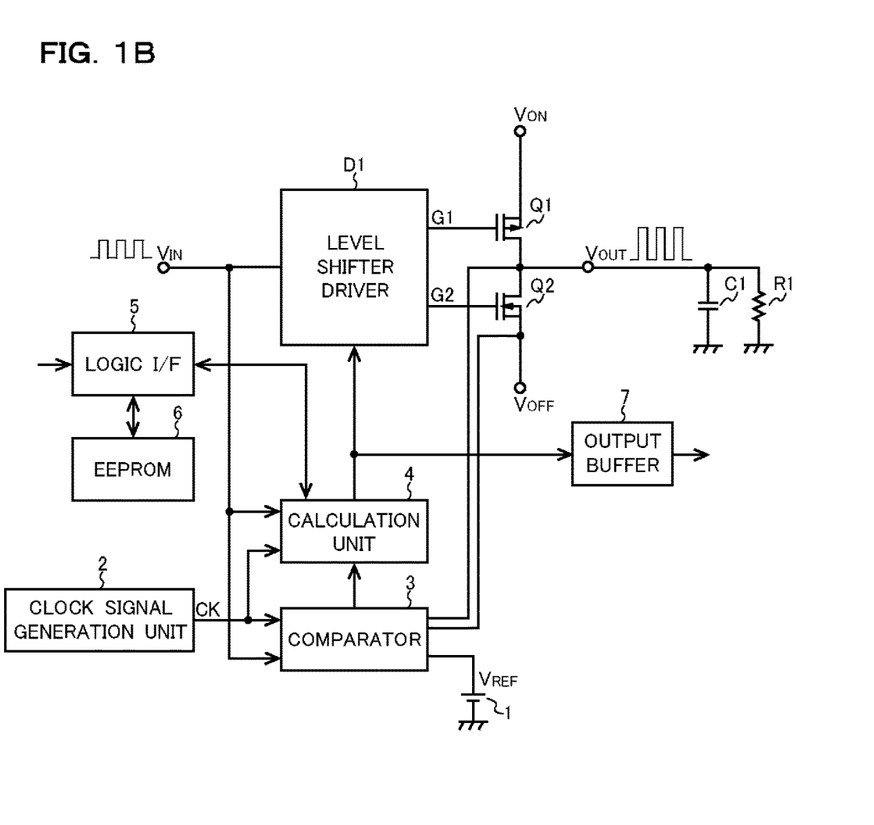
FIG. 1B is a diagram illustrating another structural example of the level shifter having the overcurrent detection function.

In addition, in the embodiment described above, overcurrent of the current flowing in the MOS transistor Q1 is detected, but it is possible to adopt the structure illustrated in FIG. 1B, in which the comparator 3 compares the drain-source voltage of the MOS transistor Q2 with the reference voltage $V_{REF}$ in the low level period of the input voltage $V_{IN}$ (the period of on state of the MOS transistor Q2), and a result of the comparison is received by the calculation unit 4. In the structure illustrated in FIG. 1B, an operation in the embodiment described above during the high level period of the input voltage $V_{IN}$ is changed to an operation during the low level period of the input voltage $V_{IN}$, but the basic operation itself is not changed, and hence detailed description thereof is omitted. With the structure illustrated in FIG. 1B, overcurrent of the current flowing in the MOS transistor Q2 is detected.

Figure 1C:
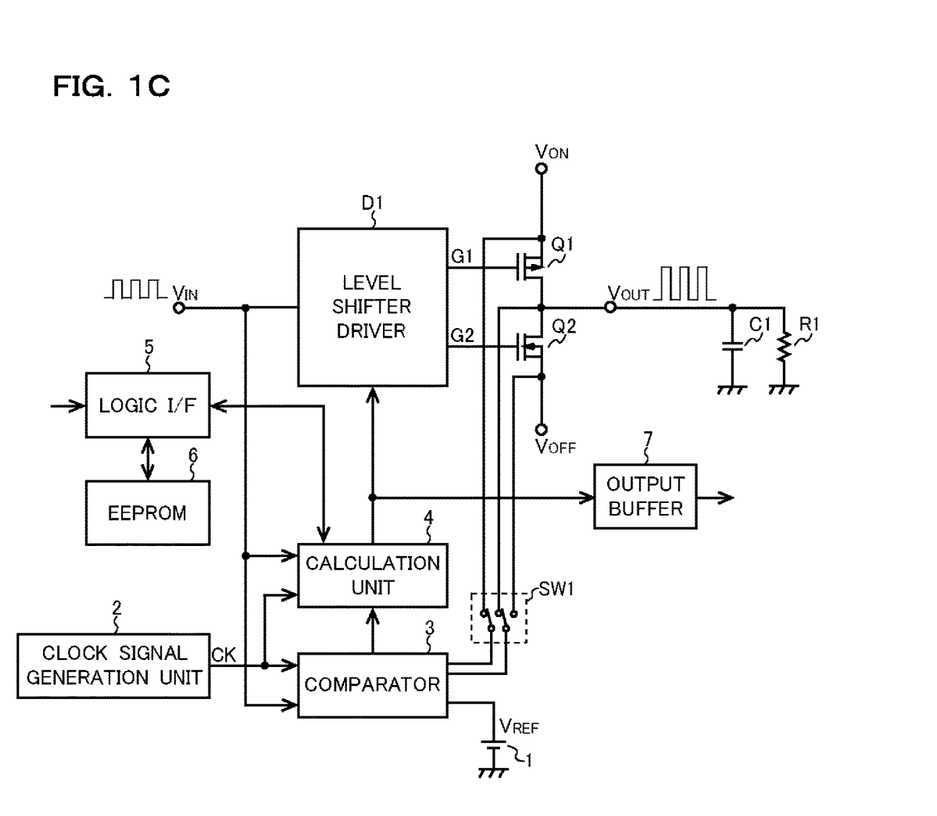
FIG. 1C is a diagram illustrating still another structural example of the level shifter having the overcurrent detection function.

Note that it is possible to combine the structure illustrated in FIG. 1A and the structure illustrated in FIG. 1B for implementation. In this case, the overcurrent detection circuit detects overcurrent of the current flowing in the MOS transistor Q1 during the high level period of the input voltage $V_{IN}$, and detects overcurrent of the current flowing in the MOS transistor Q2 during the low level period of the input voltage $V_{IN}$. In addition, the structure illustrated in FIG. 1A and the structure illustrated in FIG. 1B may be simply combined, or a switch SW1 may be disposed between the comparator 3 and the MOS transistors Q1 and Q2 as illustrated in FIG. 1C. The switch SW1 selects the drain and the source of the MOS transistor Q1 as connection targets of the comparator 3 during the high level period of the input voltage $V_{IN}$, and selects the drain and the source of the MOS transistor Q2 as connection targets of the comparator 3 during the low level period of the input voltage $V_{IN}$.

In this way, the embodiment described above is merely an example in every aspect and should not be interpreted as a limitation. The technical scope of the present invention is defined not by the above description of the embodiment but by the claims and should be understood to include all modifications within the meaning and the scope equivalent to the claims.

INDUSTRIAL APPLICABILITY

The present invention can be used for overcurrent detection in a load driving device that drives a capacitance load used in various fields (the home appliance field, the automobile field, the industrial machine field, and the like).

CONCLUSION

An example of the overcurrent detection circuit described above is an overcurrent detection circuit arranged to detect overcurrent of a load driving device that drives a capacitance load by switching a voltage applied to the capacitance load between high level and low level. The overcurrent detection circuit includes a clock signal generation unit arranged to generate a clock signal, a comparing unit arranged to compare a physical quantity corresponding to current supplied from the load driving device to the capacitance load with a predetermined value, and a determination unit arranged to determine whether or not the load driving device is in an overcurrent state based on the clock signal and a result of the comparison by the comparing unit, during a period in which the load driving device applies a high level voltage to the capacitance load (first structure).

In addition, the overcurrent detection circuit of the first structure described above may have a structure, in which the determination unit determines whether or not the load driving device is in an overcurrent state based on the number of clocks in the clock signal during a first interval in one continuous period in which the load driving device applies a high level voltage to the capacitance load, and the physical quantity corresponding to current supplied from the load driving device to the capacitance load is a predetermined value or more in the first interval (second structure).

In addition, the overcurrent detection circuit of the first or second structure described above may have a structure, in which the determination unit determines whether or not the load driving device is in an overcurrent state based on the number of clocks in the clock signal during a second interval in one continuous period in which the load driving device applies a high level voltage to the capacitance load, and the physical quantity corresponding to current supplied from the load driving device to the capacitance load is less than a predetermined value in the second interval (third structure).

In addition, the overcurrent detection circuit of the third structure may have a structure, in which the determination unit determines whether or not the load driving device is in an overcurrent state based on a ratio between the number of clocks in the clock signal during the first interval and the number of clocks in the clock signal during the second interval (fourth structure).

In addition, the overcurrent detection circuit of the first structure described above may have a structure, in which the determination unit determines whether or not the load driving device is in an overcurrent state based on a result of the comparison by the comparing unit at a rising time point or a falling time point of a predetermined order of clock in the clock signal in one continuous period in which the load driving device applies a high level voltage to the capacitance load (fifth structure).

Another example of the overcurrent detection circuit described above is an overcurrent detection circuit, which detects overcurrent of a load driving device that drives a capacitance load by switching a voltage applied to the capacitance load between high level and low level. The overcurrent detection circuit includes a clock signal generation unit arranged to generate a clock signal, a comparing unit arranged to compare a physical quantity corresponding to current supplied from the capacitance load to the load driving device with a predetermined value, and a determination unit arranged to determine whether or not the load driving device is in an overcurrent state based on the clock signal and a result of the comparison by the comparing unit, during a period in which the load driving device applies a low level voltage to the capacitance load (sixth structure).

In addition, the overcurrent detection circuit of the sixth structure may have a structure, in which the determination unit determines whether or not the load driving device is in an overcurrent state based on the number of clocks in the clock signal during a first interval in one continuous period in which the load driving device applies a low level voltage to the capacitance load, and the physical quantity corresponding to current supplied from the capacitance load to the load driving device is a predetermined value or more in the first interval (seventh structure).

In addition, the overcurrent detection circuit of the sixth or seventh structure may have a structure, in which the determination unit determines whether or not the load driving device is in an overcurrent state based on the number of clocks in the clock signal during a second interval in one continuous period in which the load driving device applies a low level voltage to the capacitance load, and the physical quantity corresponding to current supplied from the capacitance load to the load driving device is less than a predetermined value in the second interval in the second interval (eighth structure).

In addition, the overcurrent detection circuit of the eighth structure may have a structure, in which the determination unit determines whether or not the load driving device is in an overcurrent state based on a ratio between the number of clocks in the clock signal during the first interval and the number of clocks in the clock signal during the second interval (ninth structure).

In addition, the overcurrent detection circuit of the sixth structure may have a structure, in which the determination unit determines whether or not the load driving device is in an overcurrent state based on a result of the comparison by the comparing unit at a rising time point or a falling time point of a predetermined order of clock in the clock signal in one continuous period in which the load driving device applies a low level voltage to the capacitance load (tenth structure).

In addition, the overcurrent detection circuit of any one of the first to tenth structures may further include a holding unit arranged to hold a result of the comparison by the comparing unit, in which overcurrent of the load driving device is detected when the holding unit holds a predetermined number equal to or more than two of results of the comparison by the comparing unit that the load driving device is in an overcurrent state, and overcurrent of the load driving device is not detected when the holding unit does not hold the predetermined number equal to or more than two of results of the comparison by the comparing unit that the load driving device is in an overcurrent state (eleventh structure).

The load driving device having an overcurrent detection function described above includes a load driving device arranged to drive a capacitance load, and the overcurrent detection circuit of any one of the first to eleventh structures arranged to detect overcurrent of the load driving device (twelfth structure).

In addition, the load driving device having an overcurrent detection function of the twelfth structure may have a structure, in which the load driving device is a level shifter arranged to input a first pulse signal so as to generate and output a second pulse signal having a larger voltage amplitude than the first pulse signal (thirteenth structure).

The liquid crystal display device described above includes a liquid crystal display panel including a gate driver, and the load driving device having an overcurrent detection function of the thirteenth structure including the level shifter arranged to supply an output signal to the gate driver (fourteenth structure).

What is claimed is:

1. An overcurrent detection circuit arranged to detect overcurrent of a load driving device that drives a capacitance load by switching a voltage applied to the capacitance load between high level and low level, the overcurrent detection circuit comprising:
  a clock signal generation unit arranged to generate a clock signal;
  a comparing unit arranged to compare a physical quantity corresponding to current supplied from the load driving device to the capacitance load with a predetermined value; and
  a determination unit arranged to determine whether or not the load driving device is in an overcurrent state based on the clock signal and a result of the comparison by the comparing unit, during a period in which the load driving device applies a high level voltage to the capacitance load, wherein
  the determination unit determines whether or not the load driving device is in an overcurrent state based on the number of clocks in the clock signal during a first interval in one continuous period in which the load driving device applies a high level voltage to the capacitance load, and
  the physical quantity corresponding to current supplied from the load driving device to the capacitance load is a predetermined value or more in the first interval.

2. An overcurrent detection circuit arranged to detect overcurrent of a load driving device that drives a capacitance load by switching a voltage applied to the capacitance load between high level and low level, the overcurrent detection circuit comprising:
  a clock signal generation unit arranged to generate a clock signal;
  a comparing unit arranged to compare a physical quantity corresponding to current supplied from the load driving device to the capacitance load with a predetermined value; and
  a determination unit arranged to determine whether or not the load driving device is in an overcurrent state based on the clock signal and a result of the comparison by the comparing unit, during a period in which the load driving device applies a high level voltage to the capacitance load, wherein
  the determination unit determines whether or not the load driving device is in an overcurrent state based on the number of clocks in the clock signal during a second interval in one continuous period in which the load driving device applies a high level voltage to the capacitance load, and
  the physical quantity corresponding to current supplied from the load driving device to the capacitance load is less than a predetermined value in the second interval.

3. The overcurrent detection circuit according to claim 2, wherein the determination unit determines whether or not the load driving device is in an overcurrent state based on a ratio between the number of clocks in the clock signal during the first interval and the number of clocks in the clock signal during the second interval.

4. An overcurrent detection circuit arranged to detect overcurrent of a load driving device that drives a capacitance load by switching a voltage applied to the capacitance load between high level and low level, the overcurrent detection circuit comprising:
  a clock signal generation unit arranged to generate a clock signal;
  a comparing unit arranged to compare a physical quantity corresponding to current supplied from the load driving device to the capacitance load with a predetermined value; and
  a determination unit arranged to determine whether or not the load driving device is in an overcurrent state based on the clock signal and a result of the comparison by the comparing unit, during a period in which the load driving device applies a high level voltage to the capacitance load, wherein the determination unit determines whether or not the load driving device is in an overcurrent state based on a result of the comparison by the comparing unit at a rising time point or a falling time point of a predetermined order of clock in the clock signal in one continuous period in which the load driving device applies a high level voltage to the capacitance load.

5. An overcurrent detection circuit arranged to detect overcurrent of a load driving device that drives a capacitance load by switching a voltage applied to the capacitance load between high level and low level, the overcurrent detection circuit comprising:
  a clock signal generation unit arranged to generate a clock signal;
  a comparing unit arranged to compare a physical quantity corresponding to current supplied from the capacitance load to the load driving device with a predetermined value; and
  a determination unit arranged to determine whether or not the load driving device is in an overcurrent state based on the clock signal and a result of the comparison by the comparing unit, during a period in which the load driving device applies a low level voltage to the capacitance load, wherein
  the determination unit determines whether or not the load driving device is in an overcurrent state based on the number of clocks in the clock signal during a first interval in one continuous period in which the load driving device applies a low level voltage to the capacitance load, and
  the physical quantity corresponding to current supplied from the capacitance load to the load driving device is a predetermined value or more in the first interval.

6. An overcurrent detection circuit arranged to detect overcurrent of a load driving device that drives a capacitance load by switching a voltage applied to the capacitance load between high level and low level, the overcurrent detection circuit comprising:

a clock signal generation unit arranged to generate a clock signal;

a comparing unit arranged to compare a physical quantity corresponding to current supplied from the capacitance load to the load driving device with a predetermined value; and a determination unit arranged to determine whether or not the load driving device is in an overcurrent state based on the clock signal and a result of the comparison by the comparing unit, during a period in which the load driving device applies a low level voltage to the capacitance load, wherein the determination unit determines whether or not the load driving device is in an overcurrent state based on the number of clocks in the clock signal during a second interval in one continuous period in which the load driving device applies a low level voltage to the capacitance load, and the physical quantity corresponding to current supplied from the capacitance load to the load driving device is less than a predetermined value in the second interval in the second interval.

7. The overcurrent detection circuit according to claim 6, wherein the determination unit determines whether or not the load driving device is in an overcurrent state based on a ratio between the number of clocks in the clock signal during the first interval and the number of clocks in the clock signal during the second interval.

8. An overcurrent detection circuit arranged to detect overcurrent of a load driving device that drives a capacitance load by switching a voltage applied to the capacitance load between high level and low level, the overcurrent detection circuit comprising:

a clock signal generation unit arranged to generate a clock signal;

a comparing unit arranged to compare a physical quantity corresponding to current supplied from the capacitance load to the load driving device with a predetermined value; and a determination unit arranged to determine whether or not the load driving device is in an overcurrent state based on the clock signal and a result of the comparison by the comparing unit, during a period in which the load driving device applies a low level voltage to the capacitance load, wherein the determination unit determines whether or not the load driving device is in an overcurrent state based on a result of the comparison by the comparing unit at a rising time point or a falling time point of a predetermined order of clock in the clock signal in one continuous period in which the load driving device applies a low level voltage to the capacitance load.

9. An overcurrent detection circuit arranged to detect overcurrent of a load driving device that drives a capacitance load by switching a voltage applied to the capacitance load between high level and low level, the overcurrent detection circuit comprising:

a clock signal generation unit arranged to generate a clock signal;

a comparing unit arranged to compare a physical quantity corresponding to current supplied from the load driving device to the capacitance load with a predetermined value;

a determination unit arranged to determine whether or not the load driving device is in an overcurrent state based on the clock signal and a result of the comparison by the comparing unit, during a period in which the load driving device applies a high level voltage to the capacitance load; and a holding unit arranged to hold a result of the comparison by the comparing unit, wherein overcurrent of the load driving device is detected when the holding unit holds a predetermined number equal to or more than two of results of the comparison by the comparing unit that the load driving device is in an overcurrent state, and overcurrent of the load driving device is not detected when the holding unit does not hold the predetermined number equal to or more than two of results of the comparison by the comparing unit that the load driving device is in an overcurrent state.

10. An overcurrent detection circuit arranged to detect overcurrent of a load driving device that drives a capacitance load by switching a voltage applied to the capacitance load between high level and low level, the overcurrent detection circuit comprising:

a clock signal generation unit arranged to generate a clock signal;

a comparing unit arranged to compare a physical quantity corresponding to current supplied from the capacitance load to the load driving device with a predetermined value;

a determination unit arranged to determine whether or not the load driving device is in an overcurrent state based on the clock signal and a result of the comparison by the comparing unit, during a period in which the load driving device applies a low level voltage to the capacitance load; and a holding unit arranged to hold a result of the comparison by the comparing unit, wherein overcurrent of the load driving device is detected when the holding unit holds a predetermined number equal to or more than two of results of the comparison by the comparing unit that the load driving device is in an overcurrent state, and overcurrent of the load driving device is not detected when the holding unit does not hold the predetermined number equal to or more than two of results of the comparison by the comparing unit that the load driving device is in an overcurrent state.

11. A load driving device having an overcurrent detection function comprising:

a load driving device arranged to drive a capacitance load; and the overcurrent detection circuit according to claim 1, wherein the overcurrent detection circuit detects overcurrent of the load driving device.

12. A load driving device having an overcurrent detection function comprising:

a load driving device arranged to drive a capacitance load; and the overcurrent detection circuit according to claim 2, wherein the overcurrent detection circuit detects overcurrent of the load driving device.

13. A load driving device having an overcurrent detection function comprising:

a load driving device arranged to drive a capacitance load; and the overcurrent detection circuit according to claim 4, wherein the overcurrent detection circuit detects overcurrent of the load driving device.

14. A load driving device having an overcurrent detection function comprising:
a load driving device arranged to drive a capacitance load; and
the overcurrent detection circuit according to claim 9, wherein
the overcurrent detection circuit detects overcurrent of the load driving device.

15. A load driving device having an overcurrent detection function comprising:
a load driving device arranged to drive a capacitance load; and
the overcurrent detection circuit according to claim 5, wherein
the overcurrent detection circuit detects overcurrent of the load driving device.

16. A load driving device having an overcurrent detection function comprising:
a load driving device arranged to drive a capacitance load; and
the overcurrent detection circuit according to claim 6, wherein
the overcurrent detection circuit detects overcurrent of the load driving device.

17. A load driving device having an overcurrent detection function comprising:
a load driving device arranged to drive a capacitance load; and
the overcurrent detection circuit according to claim 8, wherein
the overcurrent detection circuit detects overcurrent of the load driving device.

18. A load driving device having an overcurrent detection function comprising:
a load driving device arranged to drive a capacitance load; and
the overcurrent detection circuit according to claim 10, wherein
the overcurrent detection circuit detects overcurrent of the load driving device.

19. The load driving device having an overcurrent detection function according to claim 11, wherein the load driving device is a level shifter arranged to input a first pulse signal so as to generate and output a second pulse signal having a larger voltage amplitude than the first pulse signal.

20. The load driving device having an overcurrent detection function according to claim 12, wherein the load driving device is a level shifter arranged to input a first pulse signal so as to generate and output a second pulse signal having a larger voltage amplitude than the first pulse signal.

21. The load driving device having an overcurrent detection function according to claim 13, wherein the load driving device is a level shifter arranged to input a first pulse signal so as to generate and output a second pulse signal having a larger voltage amplitude than the first pulse signal.

22. The load driving device having an overcurrent detection function according to claim 14, wherein the load driving device is a level shifter arranged to input a first pulse signal so as to generate and output a second pulse signal having a larger voltage amplitude than the first pulse signal.

23. The load driving device having an overcurrent detection function according to claim 15, wherein the load driving device is a level shifter arranged to input a first pulse signal so as to generate and output a second pulse signal having a larger voltage amplitude than the first pulse signal.

24. The load driving device having an overcurrent detection function according to claim 16, wherein the load driving device is a level shifter arranged to input a first pulse signal so as to generate and output a second pulse signal having a larger voltage amplitude than the first pulse signal.

25. The load driving device having an overcurrent detection function according to claim 17, wherein the load driving device is a level shifter arranged to input a first pulse signal so as to generate and output a second pulse signal having a larger voltage amplitude than the first pulse signal.

26. The load driving device having an overcurrent detection function according to claim 18, wherein the load driving device is a level shifter arranged to input a first pulse signal so as to generate and output a second pulse signal having a larger voltage amplitude than the first pulse signal.

27. A liquid crystal display device comprising:
a liquid crystal display panel including a gate driver; and
the load driving device having an overcurrent detection function according to claim 19, wherein
the level shifter supplies an output signal to the gate driver.

28. A liquid crystal display device comprising:
a liquid crystal display panel including a gate driver; and
the load driving device having an overcurrent detection function according to claim 20, wherein
the level shifter supplies an output signal to the gate driver.

29. A liquid crystal display device comprising:
a liquid crystal display panel including a gate driver; and
the load driving device having an overcurrent detection function according to claim 21, wherein
the level shifter supplies an output signal to the gate driver.

30. A liquid crystal display device comprising:
a liquid crystal display panel including a gate driver; and
the load driving device having an overcurrent detection function according to claim 22, wherein
the level shifter supplies an output signal to the gate driver.

31. A liquid crystal display device comprising:
a liquid crystal display panel including a gate driver; and
the load driving device having an overcurrent detection function according to claim 23, wherein
the level shifter supplies an output signal to the gate driver.

32. A liquid crystal display device comprising:
a liquid crystal display panel including a gate driver; and
the load driving device having an overcurrent detection function according to claim 24, wherein
the level shifter supplies an output signal to the gate driver.

33. A liquid crystal display device comprising:
a liquid crystal display panel including a gate driver; and
the load driving device having an overcurrent detection function according to claim 25, wherein
the level shifter supplies an output signal to the gate driver.

34. A liquid crystal display device comprising:
a liquid crystal display panel including a gate driver; and
the load driving device having an overcurrent detection function according to claim 26, wherein
the level shifter supplies an output signal to the gate driver.

* * * * *